(12) United States Patent
Boos et al.

(10) Patent No.: US 9,800,203 B2
(45) Date of Patent: *Oct. 24, 2017

(54) APPARATUS AND METHOD FOR GENERATING AN OSCILLATOR SIGNAL

(71) Applicant: Intel IP Corporation, Santa Clara, CA (US)

(72) Inventors: Zdravko Boos, Munich (DE); Bernd-Ulrich Klepser, Starnberg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/243,343

(22) Filed: Aug. 22, 2016

(65) Prior Publication Data

US 2016/0359457 A1   Dec. 8, 2016

Related U.S. Application Data

(63) Continuation of application No. 14/718,248, filed on May 21, 2015, now Pat. No. 9,431,958.

(30) Foreign Application Priority Data

Jun. 24, 2014 (DE) .................... 10 2014 108 774

(51) Int. Cl.
*H03B 5/32* (2006.01)
*H03C 5/00* (2006.01)
*H04L 27/20* (2006.01)
*H03B 5/30* (2006.01)

(52) U.S. Cl.
CPC ............... *H03B 5/32* (2013.01); *H03B 5/30* (2013.01); *H03C 5/00* (2013.01); *H04L 27/20* (2013.01)

(58) Field of Classification Search
CPC . H03B 5/32; H03B 5/36; H03B 5/326; H03B 5/30; H04L 27/12; H04L 27/20; H04L 27/22; H04L 27/14; H03C 5/00; H03D 3/00; H04B 1/16; H04B 1/40
See application file for complete search history.

(56) References Cited

U.S. PATENT DOCUMENTS

| | | |
|---|---|---|
| 5,592,659 A | 1/1997 | Toyama et al. |
| 5,767,747 A | 6/1998 | Pricer |
| 6,239,664 B1 | 5/2001 | Northam |
| 6,510,191 B2 | 1/2003 | Bockelman |
| 7,409,416 B2 | 8/2008 | Stengel |
| 7,415,247 B1 | 8/2008 | Vaisanen |
| 7,482,885 B2 | 1/2009 | Sridharan |
| 8,044,737 B2 | 10/2011 | Mohanty |

(Continued)

OTHER PUBLICATIONS

Notice of Allowance dated Apr. 27, 2016, U.S. Appl. No. 14/718,248.

(Continued)

*Primary Examiner* — Ryan Johnson
(74) *Attorney, Agent, or Firm* — Eschweiler & Potashnik, LLC

(57) ABSTRACT

An apparatus comprises a mechanical resonator-based oscillator module generating a local oscillator signal with a frequency of more than 700 MHz. Further, the apparatus comprises a digital-to-time converter module generating a frequency adapted signal based on the local oscillator signal.

17 Claims, 8 Drawing Sheets

(56) References Cited

U.S. PATENT DOCUMENTS

| | | |
|---|---|---|
| 8,258,881 B2 | 9/2012 | Walley |
| 8,860,514 B2 | 10/2014 | Weltin-Wu |
| 9,431,958 B2 * | 8/2016 | Boos ........................ H03B 5/32 |
| 2005/0212608 A1 | 9/2005 | Kato |

OTHER PUBLICATIONS

Non Final Office Action dated Feb. 5, 2016, U.S. Appl. No. 14/718,248.

* cited by examiner

APPARATUS AND METHOD FOR GENERATING AN OSCILLATOR SIGNAL

CROSS REFERENCE TO RELATED APPLICATIONS

This application is a continuation of U.S. application Ser. No. 14/718,248 filed on May 21, 2015, which claims priority to German Application number 10 2014 108 774.7 filed on Jun. 24, 2014, the contents of which are incorporated by reference in their entirety.

FIELD

The present disclosure relates to the generation of oscillator signals and in particular to an apparatus and method for generating an oscillator signal.

BACKGROUND

Oscillator signals can be generated in various ways. For example, crystal oscillators, voltage controlled oscillators or phase-locked loops PLL may be used for generating an oscillator signal. Such oscillator signals may be required in various applications. For example, processors require clock signals or transceivers require oscillator signals for frequency conversion of transmit or receive signals. It is desired to provide oscillator signals with high accuracy, high flexibility and/or low effort.

SUMMARY

There is a demand for providing a concept for generating oscillator signals with high accuracy, high flexibility, low power consumption and/or low effort.

This demand may be satisfied by the subject matter of the claims.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
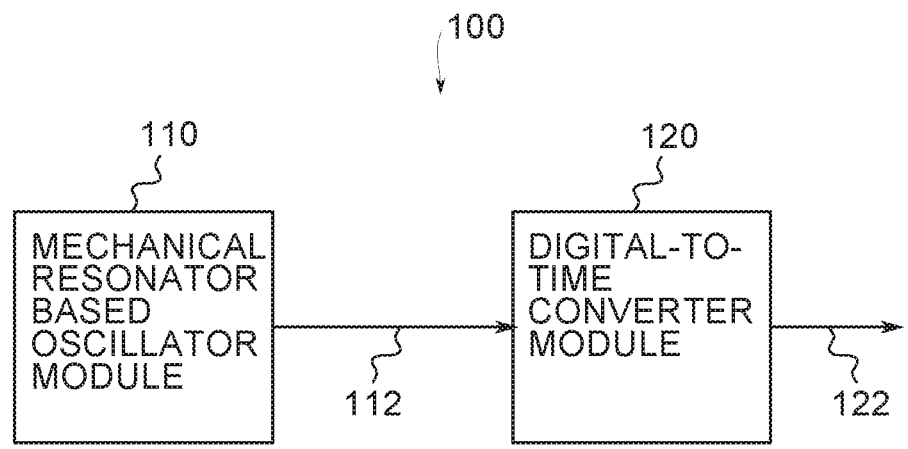
FIG. 1 shows an apparatus for generating an oscillator signal.

FIG. 1 shows a block diagram of an apparatus 100 for generating an oscillator signal according to an example. The apparatus 100 comprises a mechanical resonator-based oscillator module 110 (or a phase-locked-loop-less oscillator module or a coil-less oscillator module) generating a local oscillator signal 112 with a frequency of more than 700 MHz. Further, the apparatus 100 comprises a digital-to-time converter module 120 generating a frequency adapted signal 122 based on the local oscillator signal 112.

By using a mechanical resonator-based oscillator module for generating a high frequency oscillator signal, the implementation of a phase-locked loop PLL for generating a high frequency oscillator signal from a low frequency reference signal may be avoided. In this way, the hardware efforts, the power consumption, the required space on a semiconductor die and/or the costs may be reduced. The local oscillator signal can be adapted to an oscillator signal having a desired frequency by a digital-to-time converter. In this way, the flexibility for providing one or more oscillator signals may be increased.

The local oscillator signal 112 may be a signal (e.g. sinusoidal signal) with a very stable frequency (e.g. low phase noise). In other words, the frequency of the local oscillator signal 112 may vary by less than 1% of the frequency (or less than 0.1% or less than 0.01%) in the short term (e.g. within 1 second or within 1 minute). In the long term, the frequency of the local oscillator signal 112 may have more drift (e.g. due to temperature or aging). The frequency of the local oscillator signal 112 may be between 700 MHz and 60 GHz, between 700 MHz and 20 GHz, between 1 GHz and 15 GHz, between 7 GHz and 10 GHz or between 8 GHz and 9 GHz. For example, the frequency of the local oscillator signal 112 is larger than 700 MHz or may be larger than 1 GHz, larger than 5 GHz, larger than 7 GHz or larger than 8 GHz.

The local oscillator signal 112 is generated by a mechanical resonator-based oscillator module 110. A mechanical resonator-based oscillator 110 may be able to provide oscillator signals with very low-phase noise due to a sharp resonance frequency of a mechanical resonator. For example, the mechanical resonator-based oscillator module 110 may generate the local oscillator signal 112 based on a mechanical resonator element (e.g. piezoelectric element or micro-electromechanical element) having a resonance frequency at more than 700 MHz (or larger than 1 GHz, larger than 5 GHz, larger than 7 GHz or larger than 8 GHz). The mechanical resonator element may be a bulk acoustic wave element, a surface acoustic wave element, a piezoelectric element or a micro-electromechanical element, for example. In other words, the mechanical resonator-based oscillator module 110 may be a bulk acoustic wave-based oscillator, a surface acoustic wave-based oscillator, a piezoelectric effect based oscillator (e.g. crystal oscillator) or a micro-electromechanical system (MEMS) based oscillator (e.g. using an oscillating cantilever element or an oscillating membrane).

For example, the frequency adapted signal may be a radio frequency transmit signal or a baseband receive signal. For example, the digital-to-time converter module 120 my generate a radio frequency transmit signal or a baseband receive signal representing the frequency adapted signal based on the local oscillator signal 112 and a baseband transmit signal or a radio frequency transmit signal.

Alternatively, the frequency adapted signal may be a frequency adapted oscillator signal. The digital-to-time converter module 120 may delay the local oscillator signal 112 by a variable temporal delay to generate the frequency adapted signal 122. The frequency adapted signal 122 comprises a frequency different from a frequency of the local oscillator signal 112, for example. By using a digital-to-time converter an oscillator signal with a desired frequency may be obtained by adapting the local oscillator signal 112. Further, the digital-to-time converter module 120 may enable the generation of oscillator signals with different frequencies at different times by applying different variable temporal delays during different time intervals, for example. The digital-to-time converter module 120 may provide a high flexibility for generating an oscillator signal with desired frequency.

For example, the digital-to-time converter module 120 may apply at least a variable temporal delay to the local oscillator signal 112 in order to generate the frequency adapted signal 122. A variable temporal delay may be a delay of a signal by a delay time, which varies over time. For example, the digital-to-time converter module 120 may at least delay the local oscillator signal 112 by a first delay value (e.g. indicating a time or a phase, the signal is delayed) of the variable temporal delay at a first time and delay the local oscillator signal 112 by a second delay value of the variable temporal delay at a second time, while the first delay value is different from the second delay value. In other words, the variable temporal delay may specify a plurality of different delay values for different times or for succeeding periods of the local oscillator signal 112, for example.

For example, the digital-to-time converter module 120 may be configured to vary the delay of the local oscillator signal 102 linearly over time for at least a predefined time interval (e.g. a symbol interval of a symbol to be transmitted by a transmitter or a transceiver). In other words, the frequency adapted signal may be generated with a first phase offset (e.g. 20°) at a first time, the first phase offset plus a predefined phase offset (e.g. 20°+5°=25°) after a predefined time interval and the first phase offset plus two times the phase offset (e.g. 20°+5°+5°=30°) after two times the predefined time interval relative to the local oscillator signal 112, and so on. Further optionally, the variable temporal delay applied to the local oscillator signal 112 may comprise delay values corresponding to a combination of a first portion varying linearly over time causing a frequency offset and a second portion varying according to phases of symbols to be transmitted by a transmitter or transceiver, for example. In this example, the second portion may stay constant during symbol intervals and changes at a transition from one symbol interval to a succeeding symbol interval, while the first portion varies also within the symbol intervals.

The variable temporal delay may be selected or implemented so that the frequency of the frequency adapted signal 122 is a harmonic frequency of the frequency of the local oscillator signal 112. Alternatively, the frequency of the frequency adapted signal 122 may be a non-harmonic frequency (e.g. 1.9 GHz or 950 MHz) with regard to the frequency (e.g. 8 GHz) of the local oscillator signal 112. In this way, the cross-talk between the local oscillator signal 112 or signals derived from the reference oscillator signal 112 by dividing the frequency by an integer and the frequency adapted signal 122 may be kept low.

For example, the frequency adapted signal may comprise a frequency lower than the frequency of the local oscillator signal 112.

The usage of a mechanical resonator-based oscillator 110 for generating a high frequency local oscillator signal may avoid the implementation of an electrical resonator with a coil for generating an oscillator signal with such a high frequency. In other words, the mechanical resonator-based oscillator 110, the digital-to-time converter module 120 and the signal path used for propagating the local oscillator signal from the mechanical resonator-based oscillator module 110 to the digital-to-time converter module 120 may be coil-less (implemented without a coil structure). For example, the signal path used for propagating the local oscillator signal 112 may be implemented without a loop (one or more windings implemented by metal lines crossing at different metal layers above a semiconductor substrate). In this way, the inductance at an input terminal of the digital-to-time converter module 120 for receiving the local oscillator signal 112 towards ground or another reference potential may be kept low. For example, an inductance between a local oscillator signal input terminal (input terminal for receiving the local oscillator signal) of the digital-to-time converter module 120 and the reference potential terminal (e.g. electrically-conductive structure at ground potential, for example, on chip ground wiring or ground pad) may be lower than 1 nH or lower than 500 pH or lower than 200 pH (e.g. at 8 GHz frequency of the local oscillator signal).

Further, the usage of a mechanical resonator-based oscillator module 110 capable of generating a high frequency local oscillator signal in combination with a digital-to-time converter module 120 capable of generating an oscillator signal with desired frequency may allow a phase-locked loop-less implementation. In other words, the mechanical resonator-based oscillator module 110, the digital-to-time converter module 120 and a signal path of the local oscillator signal 112 between the mechanical resonator-based oscillator module 110 and the digital-to-time converter module 120 may be phase-locked loop-less. A phase-locked loop-less implementation may reduce the power consumption, the area consumption on a semiconductor substrate and/or the costs, for example.

Figure 2:
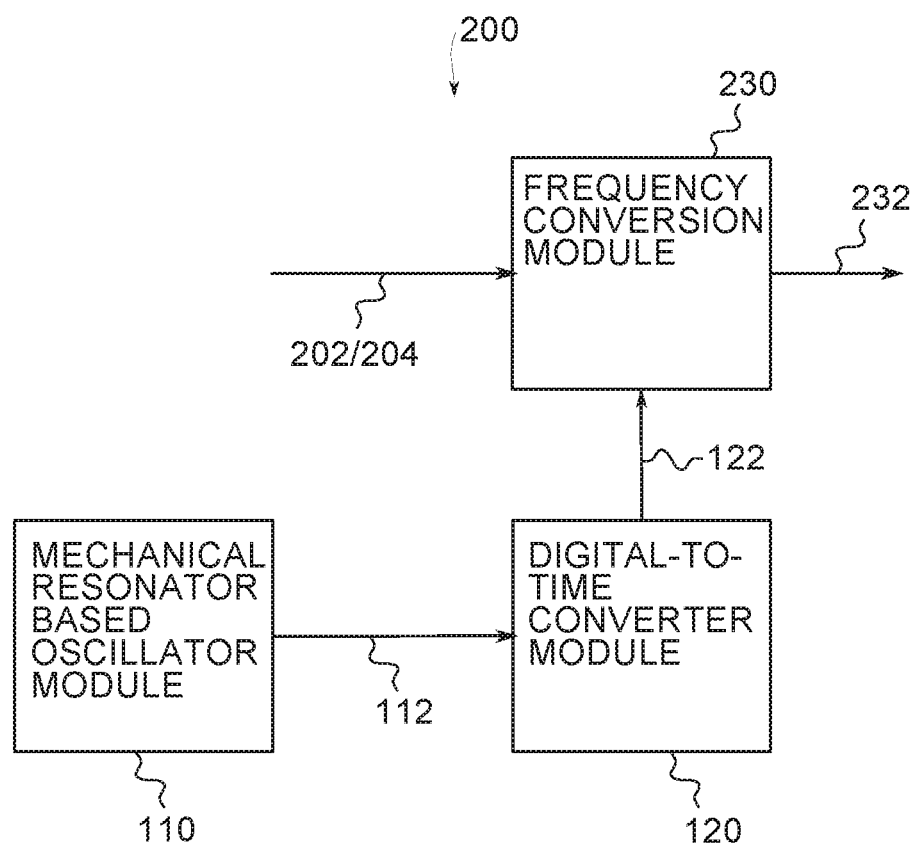
FIG. 2 shows a block diagram of an apparatus for generating an oscillator signal used by a frequency conversion module.

The frequency adapted signal 122 may be used for a frequency conversion of a transmit signal or a receive signal, for example. FIG. 2 shows a block diagram of an apparatus 200 for generating a frequency-converted signal according to an example. The implementation of the apparatus 200 is similar to the implementation of the apparatus shown in FIG. 1. However, the apparatus 200 comprises additionally a frequency conversion module 230. The frequency conversion module 230 generates a frequency-converted signal 232 based on the frequency adapted signal 122 and a baseband transmit signal 202 or a radio frequency receive signal 204.

The baseband transmit signal 202 may be a transmit signal in the baseband frequency domain provided by a baseband processor for transmission (e.g. wireless transmission) to an external receiver. The baseband transmit signal 202 may be a complex-valued transmit signal in a polar-modulation representation (e.g. comprising an amplitude component and a phase component) or in an in-phase-quadrature-phase representation (e.g. comprising an in-phase component and a quadrature-phase component).

The radio frequency receive signal 204 may be a receive signal in the radio frequency domain received from an external transmitter, for example.

The frequency-converted signal 232 may be a baseband domain signal (e.g. baseband receive signal) or a radio frequency domain signal (e.g. radio frequency transmit signal), for example.

In one example, the frequency adapted signal 122 is used for generating a radio frequency transmit signal representing the frequency-converted signal 232. For example, the (first) digital-to-time converter module 120 may generate the frequency adapted signal 122 based on the local oscillator signal 112 and a phase component of a (polar-modulated) baseband transmit signal 202. Further, the frequency conversion module 230 may generate a radio frequency transmit signal representing the frequency-converted signal 232 based on the frequency adapted signal 122 and an amplitude component of the (polar-modulated) baseband transmit signal 202 (e.g. by mixing the amplitude component of the baseband transmit signal with the frequency adapted signal). In this way, a transmitter or transceiver may be implemented.

In another example, the frequency adapted signal 122 may be used for generating a baseband receive signal representing the frequency-converted signal 232. For example, the (first) frequency conversion module 230 may generate a baseband receive signal representing the frequency-converted signal 232 based on the (first) frequency adapted signal 122 and a radio frequency receive signal 204. In this way, a receiver or transceiver may be implemented.

In other words, the frequency conversion module 230 may implement a transmitter module or a receiver module. Optionally, the apparatus 200 may comprise more than one frequency conversion module for implementing one or more transmit paths and/or one or more receive paths of a transmitter, receiver or transceiver.

For example, the apparatus 200 may comprise a second digital-to-time converter module providing a second frequency adapted signal based on the local oscillator signal 112. Further, the apparatus 200 may comprise a second frequency conversion module generating a second frequency-converted signal (e.g. radio frequency transmit signal or baseband receive signal) based on the second frequency adapted signal and a baseband transmit signal or a radio frequency receive signal.

The digital-to-time converter module 120 and the frequency-conversion module 230 may be implemented on the same semiconductor die and the mechanical resonator-based oscillator module 110 may be formed on another semiconductor die coupled to the semiconductor die of the digital-to-time converter module 120 and the frequency conversion module 230. Alternatively, the mechanical resonator-based oscillator module 110, the digital-to-time converter module 120 and the frequency-conversion module 230 may be implemented on the same semiconductor die. For example, due to a coil-less and/or PLL-less implementation of the mechanical resonator-based oscillator module, the mechanical resonator-based oscillator module, the digital-to-time converter module and the frequency conversion module may be manufacturable by the same semiconductor manufacturing technology.

More details and aspects of the apparatus 200 are mentioned in connection with the proposed concept or one or more examples described above (e.g. FIG. 1). The apparatus 200 may comprise one or more additional optional features corresponding to one or more aspects described in connection with the proposed concept or one or more examples described above or below (e.g. one or more digital-to-time converter modules, one or more frequency-conversion modules, a standby control module and/or a deviation determining module).

Figure 3:
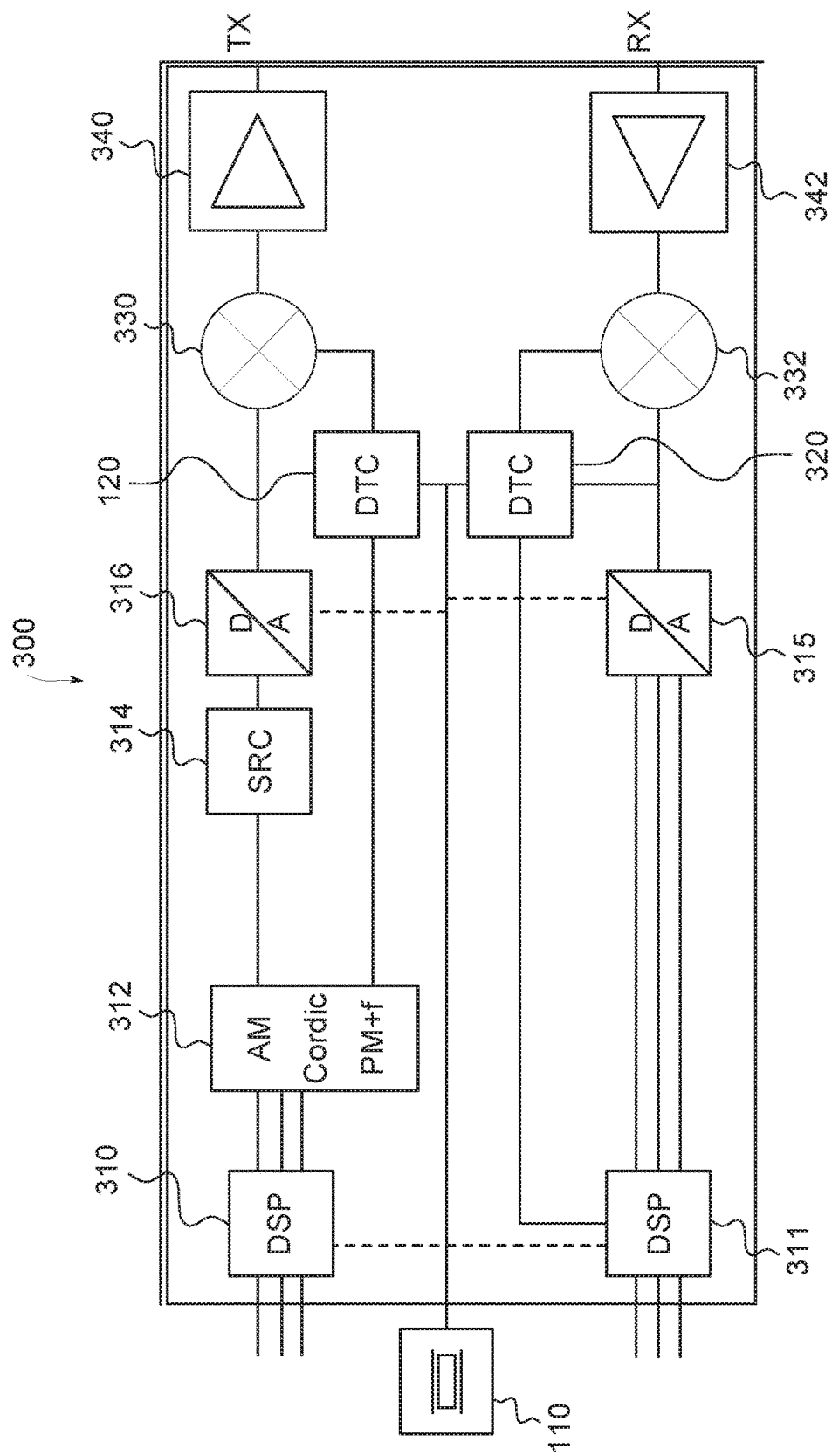
FIG. 3 shows a block diagram of an apparatus for generating a radio frequency transmit signal and a baseband receive signal.

FIG. 3 shows a block diagram of a transceiver 300 or a part of a transceiver according to an example. The implementation of the transceiver 300 is similar to the implementation of the apparatus shown in FIG. 2 with one transmit path and one receive path as mentioned above.

The transceiver comprises a mechanical resonator-based oscillator module 110 providing a local oscillator signal with a frequency of more than 700 MHz to two digital-to-time converter modules 120, 320 (or more digital-to-time converter modules for additional transmit or receive paths). The first digital-to-time converter, the transceiver 300 comprises a transmitter module representing a first frequency conversion module and a receiver module representing a second frequency conversion module. The receiver module receives a radio frequency receive signal (RX) from an external or internal antenna module at an input. Further, the receiver module comprises an amplifier 342 (e.g. low noise amplifier) for amplifying the radio frequency receive signal RX and a mixer 342 for a down conversion of the amplified radio frequency receive signal from the radio frequency domain to the baseband domain. The mixer 342 of the receiver module generates a baseband receive signal by mixing the frequency adapted signal provided by the second digital-to-time converter module 320 and the amplified radio frequency receive signal, for example. Further, the receiver module comprises an analog-to-digital converter 315 for converting the baseband receive signal provided by the mixer 342 to a digital baseband receive signal. The digital baseband receive signal generated by the digital-to-analog converter 315 is provided to a digital signal processor 311 of the receiver module. The digital signal processor 311 of the receiver module may be part of the receiver module or may be implemented by a baseband processor module connected to the transceiver 300.

The second digital-to-time converter module 320 may provide the frequency adapted signal additionally to the digital signal processor 311 (e.g. for further processing of the baseband receive signal or as clock signal).

In other words, the second frequency conversion module represented by the receiver module may generate a baseband receive signal representing the frequency-converted signal based on the second frequency adapted signal and a radio frequency receive signal, for example.

The transmitter module comprises a digital signal processor module 310 or a digital signal processor module 310 may be connected to the transmitter module. The digital signal processor module 310 may be a processor or a part of a processor (e.g. baseband processor) connected to the transceiver 300. The digital signal processor 310 of the transmitter module and the digital signal processor 311 of the receiver module may be implemented together (e.g. by a baseband processor). The digital signal processor module 310 of the transmitter module provides a baseband transmit signal (e.g. in-phase-quadrature-phase representation). Further, the transmitter module comprises a polar coordinate provider 312 converting the in-phase-quadrature-phase baseband transmit signal to a polar-modulated baseband transmit signal (e.g. by using a CORDIC algorithm, coordinate rotation digital computer). The phase component PM of the polar-modulated baseband transmit signal is provided to the first digital-to-time converter module 120. The first digital-to-time converter module 120 generates the frequency adapted signal with an additional phase modulation based on the phase component of the baseband transmit signal (e.g. comprising different phases for different symbols to be transmitted). The phase-modulated frequency adapted signal is provided to a mixer 330 of the transmitter module. The amplitude component of the polar-modulated baseband transmit signal is provided to a sample rate converter 314 (SRC). The optional sample rate converter 314 carries out the sample rate conversion and provides a signal resulting from the conversion to a digital-to-analog converter 316. The digital-to-analog converter 316 converts the signal provided by the sample rate converter 314 from digital to analog and provides the analog signal to the mixer 330 of the transmitter module. The mixer 330 of the transmitter module mixes the analog amplitude-modulated baseband transmit signal with the frequency adapted signal provided by the first digital-to-time converter 120 to generate a radio frequency transmit signal. The output of the mixer may be coupled to an internal or external antenna module through an amplifier module 340 (e.g. and a matching network) to transmit the amplified radio frequency transmit signal TX through the antenna module to an external receiver.

Optionally, the local oscillator signal provided by the mechanical resonator-based oscillator module 110 or an oscillator signal derived from the local oscillator signal by a frequency divider dividing the frequency of the local oscillator signal by an integer may be additionally provided to the digital signal processor module 310 of the transmitter module, the digital signal processor module 311 of the receiver module, the digital-to-analog converter 316 of the transmitter module and/or the analog-to-digital converter 315 of the receiver module (e.g. as clock signal).

FIG. 3 may show an example of a block diagram of a radio frequency RF transceiver based on an RF reference oscillator (mechanical resonator-based oscillator module).

The proposed architecture may no longer contain a digital-controlled oscillator DCO or voltage-controlled oscillator VCO and therefore no oscillator tank circuits, for example. Also it may no longer require a DPLL (digital phase-locked loop) with phase detector or TDC (time-to-digital converter) and/or a loop filter. In this way, the current consumption and/or chip area may be reduced.

A fixed high-frequency signal may be generated by the RF reference oscillator (mechanical resonator-based oscillator module). The different RF frequency for RX (receive path) and TX (transmit path) may be generated by DTC (digital-to-time converter) circuits. In this way, the programmable RF frequency may be either fix in frequency or phase-modulated, for example.

In contrast, other RF synthesizers may be based on a programmable RF oscillator-based synthesizer. In case of multiple RF carriers active at the same time, also multiple synthesizers are required by such systems, for example.

For example, the mechanical resonator based oscillator module of a proposed apparatus may provide the local oscillator signal to all digital-to-time converter modules of a transceiver. In this way, a single oscillator may be sufficient for enabling the generation of all oscillator signals required by the transceiver.

More details and aspects of the transceiver 300 are mentioned in connection with the proposed concept or one or more examples described above (e.g. FIGS. 1 to 2). The transceiver 300 may comprise one or more additional optional features corresponding to one or more aspects described in connection with the proposed concept or one or more examples described above or below.

Figure 4:
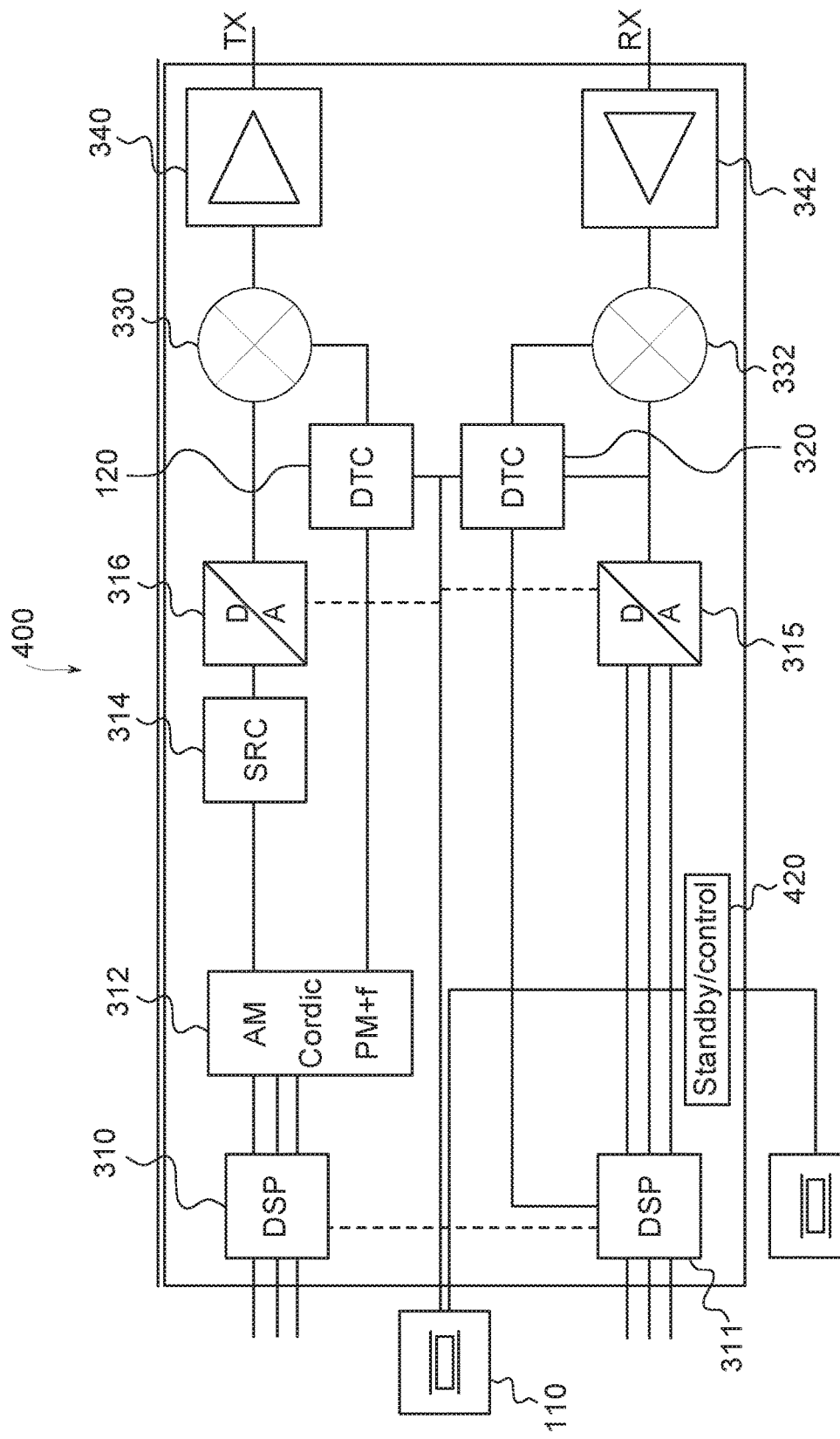
FIG. 4 shows a block diagram of an apparatus for generating a radio frequency transmit signal and a baseband receive signal comprising a standby control module.

FIG. 4 shows a block diagram of a transceiver 400 or a part of a transceiver according to an example. The implementation of the transceiver 400 is similar to the transceiver shown in FIG. 3. Additionally, the transceiver 400 comprises a low frequency oscillator module 410 and a standby control module 420. The low frequency oscillator module 410 generates a reference oscillator signal with a frequency below 100 MHz. The standby control module 420 triggers a switching from an off-state to an on-state of the mechanical resonator-based oscillator module 110 based on the reference oscillator signal.

By using a low frequency oscillator with low power consumption for implementing a wakeup procedure for the mechanical resonator-based oscillator 110, the mechanical resonator-based oscillator module 110 can be switched off or switched to a standby mode. In this way, the current consumption may be reduced during time intervals, when the local oscillator signal generated by the mechanical resonator-based oscillator module 110 is not required (e.g. if no signal is transmitted or received), for example.

The low frequency oscillator module 410 may provide the reference oscillator signal with a frequency sufficient for enabling the wakeup of the high frequency mechanical resonator-based oscillator module 110 sufficiently fast, if the mechanical resonator-based oscillator module is required. The low frequency oscillator module may generate the reference oscillator signal with a frequency below 100 MHz (or below 10 MHz, below 1 MHz or below 100 KHz, for example with a frequency of 38.4 MHz).

For example, the low frequency oscillator module may be a crystal oscillator.

The standby control module 420 may provide a control signal to the mechanical resonator-based oscillator module 110 for switching the mechanical resonator-based oscillator module to different states (e.g. on-state, off-state or other state). The mechanical resonator-based oscillator module 110 may be configured to receive the control signal from the standby control module 420 and may switch from an off-state (or standby mode) to an on-state. The mechanical resonator-based oscillator module 110 may be configured to generate the local oscillator signal in an on-state and deactivates the generation of the local oscillator signal in an off-state.

Additionally, the standby control module 420 may optionally trigger a switching from an on-state to an off-state of the low frequency oscillator module 410, if the mechanical resonator-based oscillator module 110 is in an on-state. In this way, the power consumption may be reduced.

Alternatively or additionally, the reference oscillator signal generated by the low frequency oscillator module 410 may be used by additional modules (e.g. clock signal of a baseband processor module).

During standby mode, the basic timing and the wakeup of the RF synthesizer (mechanical resonator-based oscillator module) may be controlled by the low power reference oscillator, (low frequency oscillator module, e.g. 32 kHz crystal) and the digital signal processor DSP (standby control module, which may be part of a DSP or baseband processor), for example. This crystal (low frequency oscillator module) and/or the DSP may be integrated on the transceiver (same semiconductor die) or another chip, but may be located somewhere in the system platform (e.g. baseband BB, application processor AP or other radio access technology RAT chips).

During active mode, the RF reference may be active and may provide an RF reference (e.g. 9 GHz). Each variable RX (receiver) or TX (transmitter) RF channel frequency may be generated by a separate DTC, for example. In case of an in-phase-quadrature-phase IQ architecture, this frequency may be also at twice the RF frequency for 0-90° IQ generation. For example, none of the resonators is on chip and a coil-less RF synthesizer may be enabled.

In addition, the tolerances of the two fixed reference oscillators (mechanical resonator-based oscillator module and low-frequency oscillator module) may be aligned against each other. For example, the knowledge of the frequency of a BAW (bulk acoustic wave) resonator may be known very precisely by feedback from the base station. By a measurement of both frequencies against each other (e.g. by a time-to-digital converter TDC), the accuracy of the low power timing of the cheap low power reference (low frequency oscillator module) may be improved. Furthermore, the aging of both reference oscillators may be monitored by this comparison.

For example, the apparatus or transceiver shown in one of the examples above may further comprise a deviation determining module generating a deviation signal based on the local oscillator signal and the reference oscillator signal. The deviation signal may comprise information indicating a deviation of the local oscillator signal or the reference oscillator signal from a desired behavior (e.g. desired maximal phase noise, maximal temperature drift and/or maximal aging drift).

For example, the RF reference (mechanical resonator-based oscillator module) may be calibrated from the standby quartz (low frequency oscillator module). For example, a short-term deviation of the RF reference frequency may be determined by comparison with the standby quartz (comparison with the reference oscillator signal), assuming short-term variations may be due to RF reference oscillator drift and may take it into account to update the ratio of the RF reference frequency to a desired output frequency to be set in fractional DTC, for example. In other words, the digital-to-time converter module may provide the frequency adapted signal based on the local oscillator signal and the deviation signal. For example, the standby quartz may be more temperature-stabile on a short-term scale than the RF reference (mechanical resonator-based oscillator module). On the long-term (e.g. tens of seconds) the standby quartz may still be calibrated against a network signal, but during reception gaps in the order of 10 to 30 seconds, when no network signal is available, the standard quartz may serve as a calibration source for the RF reference, for example. For example, the standby quartz is not switched on all the time the reference is running, only during times when there is no signal from the network available.

FIG. 4 may show an example of a DTC-based RF transceiver with variable RX and TX frequencies using a fixed RF reference oscillator and a second low power reference oscillator to control the timing of the RF synthesizer in standby mode or when no network signal is available.

More details and aspects of the transceiver 400 are mentioned in connection with the proposed concept or one or more examples described above (e.g. FIGS. 1 to 3). The transceiver 300 may comprise one or more additional optional features corresponding to one or more aspects described in connection with the proposed concept or one or more examples described above or below.

Figure 5:
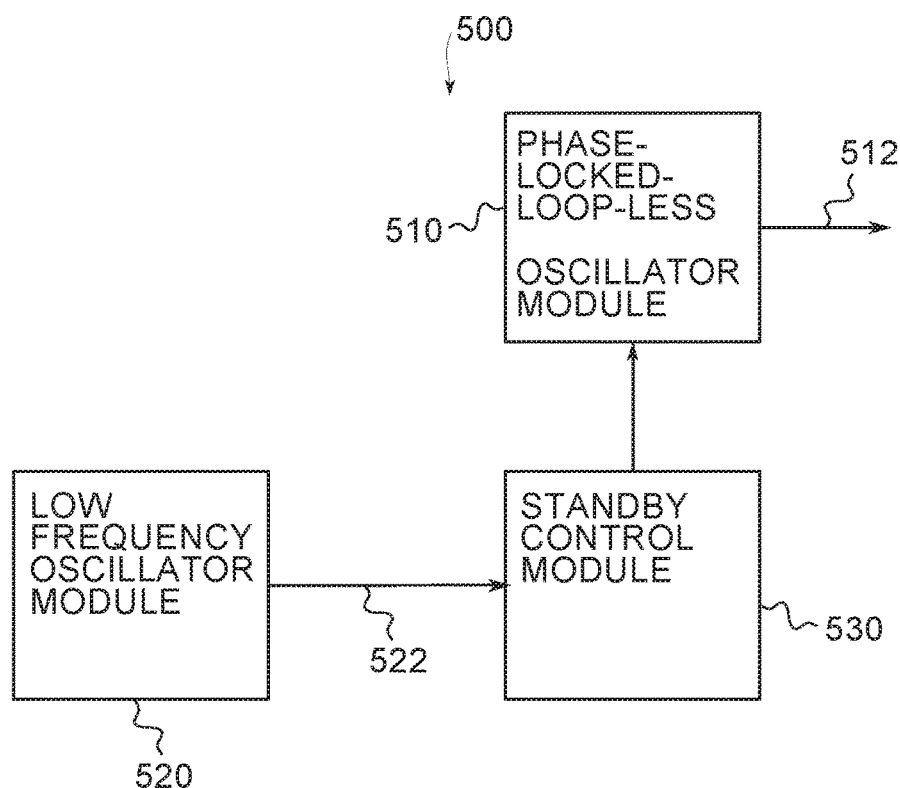
FIG. 5 shows an apparatus for generating an oscillator signal comprising a standby control module.

FIG. 5 shows a block diagram of an apparatus 500 for generating a local oscillator signal according to an example. The apparatus 500 comprises a phase-locked loop-less oscillator module 510, a low frequency oscillator module 520 and a standby control module 530. The phase-locked loop-less oscillator module 510 generates a local oscillator signal 512 with a frequency of more than 700 MHz and the low frequency oscillator module 520 generates a reference oscillator signal 522 with a frequency below 100 MHz. Further, the standby control module 530 triggers a switching from an off-state to an on-state of the phase-locked loop-less oscillator module 510 based on the reference oscillator signal 522.

By deactivating the phase-locked loop-less oscillator module 510, if the reference oscillator signal 512 is not required, the power consumption may be reduced, since the low frequency oscillator module 520 may comprise significantly lower power consumption than the phase-locked loop-less oscillator module 510.

The phase-locked loop-less oscillator module 510 may be a mechanical resonator-based oscillator module as described in one or more examples above or below or another oscillator module without a phase-locked loop.

More details and aspects of the apparatus 500 are mentioned in connection with the proposed concept or one or more examples described above (e.g. regarding the low frequency oscillator module, the reference oscillator signal, the standby control module or other details and aspects mentioned in connection with FIGS. 1 to 4, for example). The apparatus 500 may comprise one or more additional optional features corresponding to one or more aspects described in connection with the proposed concept or one or more examples described above or below (e.g. one or more digital-to-time converter modules, one or more frequency-conversion modules and/or a deviation determining module).

Figure 6:
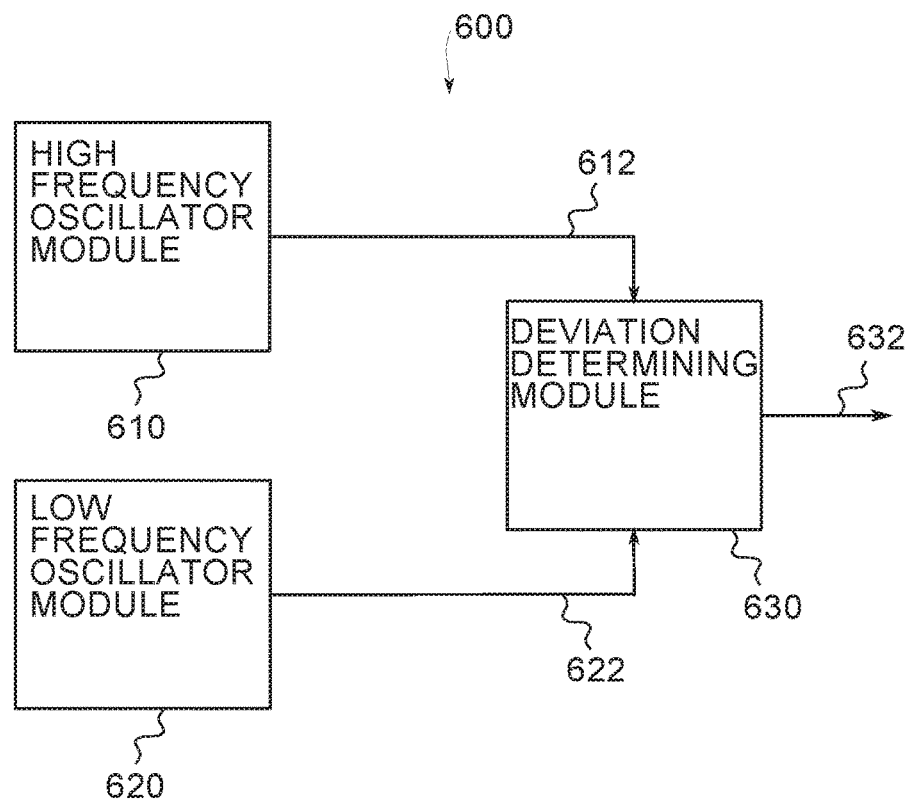
FIG. 6 shows a block diagram of an apparatus for generating an oscillator signal comprising a deviation determining module.

FIG. 6 shows a block diagram of an apparatus 600 for generating a local oscillator signal according to an example. The apparatus 600 comprises a high frequency oscillator module 610, a low frequency oscillator module 620 and a deviation determining module 630. The high frequency oscillator module 610 generates a local oscillator signal 612 with a frequency of more than 700 MHz and the low frequency oscillator module 620 generates a reference oscillator signal 622 with a frequency below 100 MHz. Further, the deviation determining module 630 generates a deviation signal 632 based on the local oscillator signal 612 and the reference oscillator signal 622. The deviation signal 632 comprises information indicating a deviation of the local oscillator signal 612 or the reference oscillator signal 622 from a desired behavior.

By using two different oscillators for generating oscillator signals with different frequencies, a comparison of the two oscillator signals may enable the determination of a deviation of at least one of the signals from a desired behavior (e.g. maximal phase noise, maximal temperature drift and/or maximal aging drift).

The high frequency oscillator module may be a mechanical resonator-based oscillator module as described in one or more examples above or below or another oscillator providing an oscillator signal with a frequency of more than 700 MHz.

The deviation-determining module 630 may generate the deviation signal 632 based on a comparison of the local oscillator signal 612 and the reference oscillator signal 622.

For example, the deviation signal 632 may comprise information indicating a temperature drift or an aging drift of the local oscillator signal 612 or the reference oscillator signal 622.

More details and aspects of the apparatus 600 are mentioned in connection with the proposed concept or one or more examples described above (e.g. regarding the high frequency oscillator module, the local oscillator signal, the low frequency oscillator module, the reference oscillator signal, the deviation determining module or other details and aspects mentioned in connection with FIGS. 1 to 5, for example). The apparatus 600 may comprise one or more additional optional features corresponding to one or more aspects described in connection with the proposed concept or one or more examples described above or below (e.g. one or more digital-to-time converter modules, one or more frequency-conversion modules and/or a standby control module).

Some examples relate to a digital-to-time converter employing a BAW oscillator as reference signal. A proposed apparatus may be used in a radio circuit, a high-volume architecture or may be embodied in computer system architecture features and interfaces made in high volumes, may encompass IA (input architecture) or devices (e.g. transistors) and associated multifunction devices MFG processes, for example.

Monolithically-integrated RF transceivers may contain a PLL to generate the desired RF carrier frequency. In order to achieve a low-phase noise, an integrated RF oscillator with high Q resonator may be required. The high quality factor may be achieved by low resistivity metal layers and a high resistivity substrate, for example. This may result in specific RF process flavors and may limit the ease to integrate RF transceivers with baseband BB blocks due to the difference in process technologies. A proposed apparatus with a PLL-less oscillator may be better compatible to process technologies used for forming baseband blocks, for example.

The PL architecture based on DCO (digital controlled oscillator) employing a coil may be replaced with an RF reference oscillator based on a coil-less resonator, for example.

A proposed synthesizer architecture may use the DTC frequency generation based on programmable offset frequencies. Since the generation of multiple programmable RF frequency may be based on a fixed high reference signal, the programmable elements (e.g. VCO, PLL) may be eliminated from the synthesizer. This may be possible by changing the process technology from the reference oscillator from crystal-based low frequency signals in the MHz range to bulk acoustic wave BAW or micro-electromechanical system MEMS (micro-electromechanical system) based fixed frequency oscillators in the higher GHz range, for example.

A proposed apparatus or transceiver may require no DPLL for the generation of the high frequency signal (local oscillator signal) and/or the frequency range may be without limitation by a small tuning range of filters of systems as tags or 848 MHz excess systems (directly generating the RF frequency). Further, the combination with the DTC may allow to generate RF frequencies outside the range of the filters. For example, all communication frequencies from 700 MHz to 3 GHz may be generated from a single fixed frequency above 8 GHz. The combination with the DTC may further allow to generate multiple, different RF frequencies from a single RF reference. The absence of an inductor in the synthesizer path may significantly reduce crosstalk between simultaneous RF channels, for example. Further, the absence of an inductor in the synthesizer path may allow easier integration into a purely digital process technology and may ease integration with other baseband BB blocks of the communication device, for example.

Although Gigahertz filters may be more expensive than 38.4 MHz crystal oscillators, multiple technologies may be able to target this application. BAW (bulk acoustic wave), SAW or MEMS development may lead to a better cost position. Further, the DCO/DPLL based synthesizer may be one of the biggest blocks of other transceivers which may be eliminated by the proposed concept. According to an aspect, a synthesizer architecture for mobile communication application without a PLL is described.

A transceiver concept enabling use of free running crystal oscillator or MEMS reference oscillator system may also tolerate RF reference oscillator tolerances caused by temperature or aging, for example. Dynamic or static tolerances of the reference frequency may be measured and corrected in the baseband BB part (or via communication with base stations). Static tolerances of the RF reference oscillator may be measured and corrected versus a different crystal oscillator in the same mobile device. Static or dynamic coherences of the RF reference frequency may be compensated digitally by hardware HW or firmware FW (e.g. in the RF transceiver or BB chip). Static or dynamic tolerances of the RF reference frequency may be compensated by an additional offset generated by individual DTCs in the RX or TX signal generation paths, for example.

The proposed concept may be used in polar and I/Q TX modulator and zero IF (intermediate frequency) and low IF receivers, for example, with and without multiple carrier aggregation in downlink and uplink.

Based on the proposed concept, a digital TXRX concept may be implemented. An apparatus or a transceiver according to the proposed concept may enable a reduction of the chip area (cost), a reduction of the crosstalk (development time) and/or a reduction of the current (longer battery life), for example.

Some examples relate to a DTC with RF and low power reference oscillators. For example, a BAW oscillator, a coil-less RF synthesizer and/or a DTC may be implemented. An apparatus according to the proposed concept may be embodied in products other than high volume architecture also and may encompass test systems and design/debug tools that although used to make products would themselves be low volume, for example.

For example, to achieve a low standby in current, a second reference oscillator may be used. A DTC architecture, a fix RF reference oscillator (e.g. BAW technology), a second low power reference oscillator (e.g. 32 kHz crystal XO technology), which controls the enable signal for the RF reference oscillator via a DSP/controller during standby mode timing) and an RF transceiver with variable RX and TX frequency may be implemented.

In this way, a coil-less and low standby power RF transceiver architecture for variable RF frequencies may be enabled. The tolerances of both reference oscillators may be adjusted as described above, for example.

In other words, a low standby current, and a coil-less RF synthesizer may be enabled by using a fixed frequency RF reference oscillator, for example.

Further examples relate to a mobile device (e.g. a cell phone, a tablet or a laptop) comprising a transmitter, a receiver or a transceiver described above. The mobile device or mobile terminal may be used for communicating in a mobile communication system.

Figure 7:
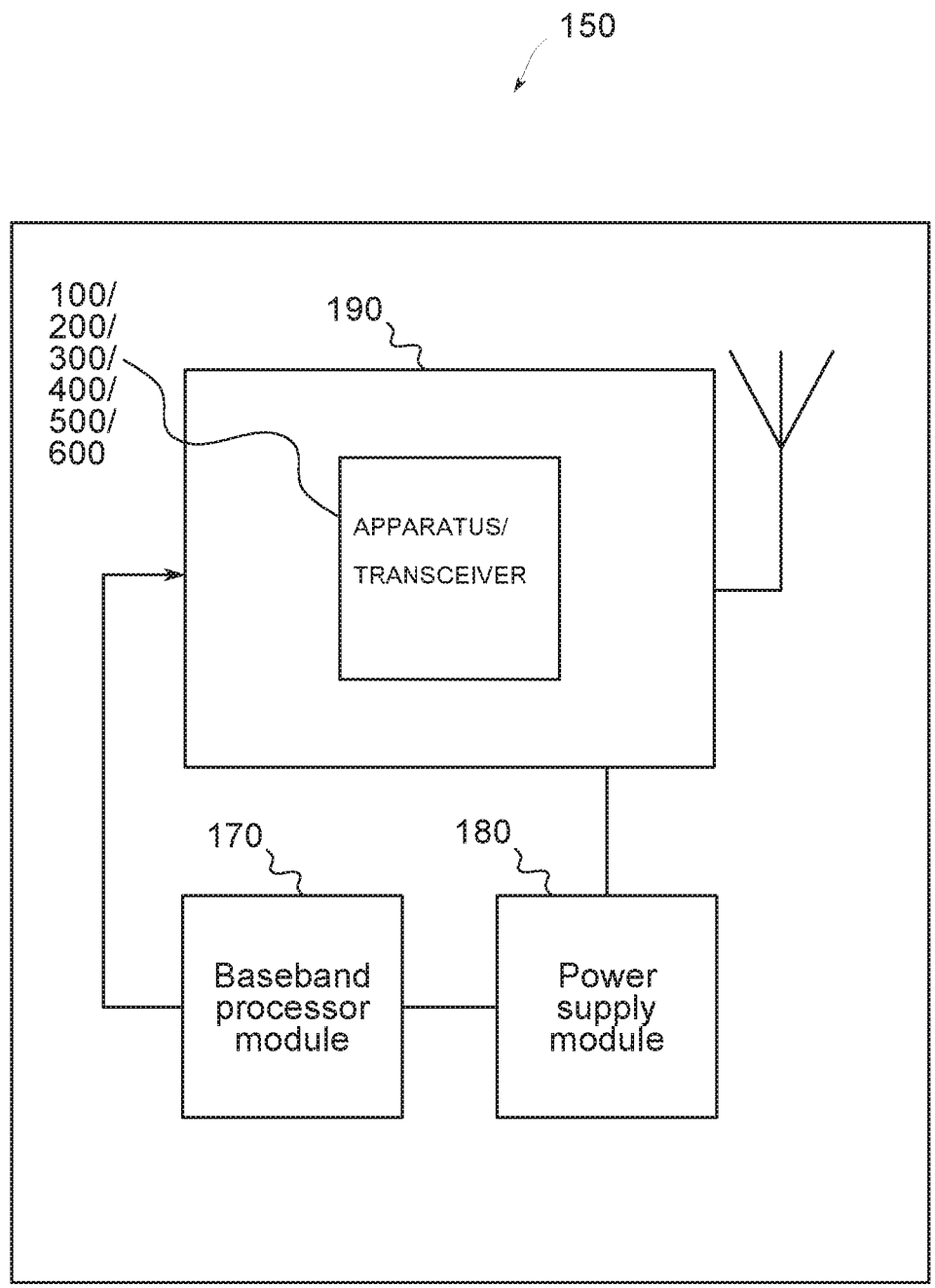
FIG. 7 shows a block diagram of a mobile device.

FIG. 7 shows a schematic illustration of a mobile device 150. The mobile device 150 comprises an apparatus 100, 200, 300, 400, 500, 600 (e.g. FIG. 1-6) for generating an oscillator signal within a transmitter, a receiver or a transceiver 190. Further, the mobile device 150 comprises a baseband processor module 170 generating at least the baseband signal to be transmitted and/or processing a baseband receive signal. Additionally, the mobile device 150 comprises a power supply unit 180 supplying at least the transmitter, the receiver or the transceiver 190 and the baseband processor module 170 with power.

In some examples, a cell phone may comprise a transmitter, a receiver or a transceiver comprising an apparatus for generating at least one oscillator signal according to the proposed concept or one or more examples described above.

Further, some examples relate to a base station or a relay station of a mobile communication system comprising a transmitter, a receiver or a transceiver with an apparatus for generating at least one oscillator signal according to the described concept or one or more examples described above.

A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

Figure 8:
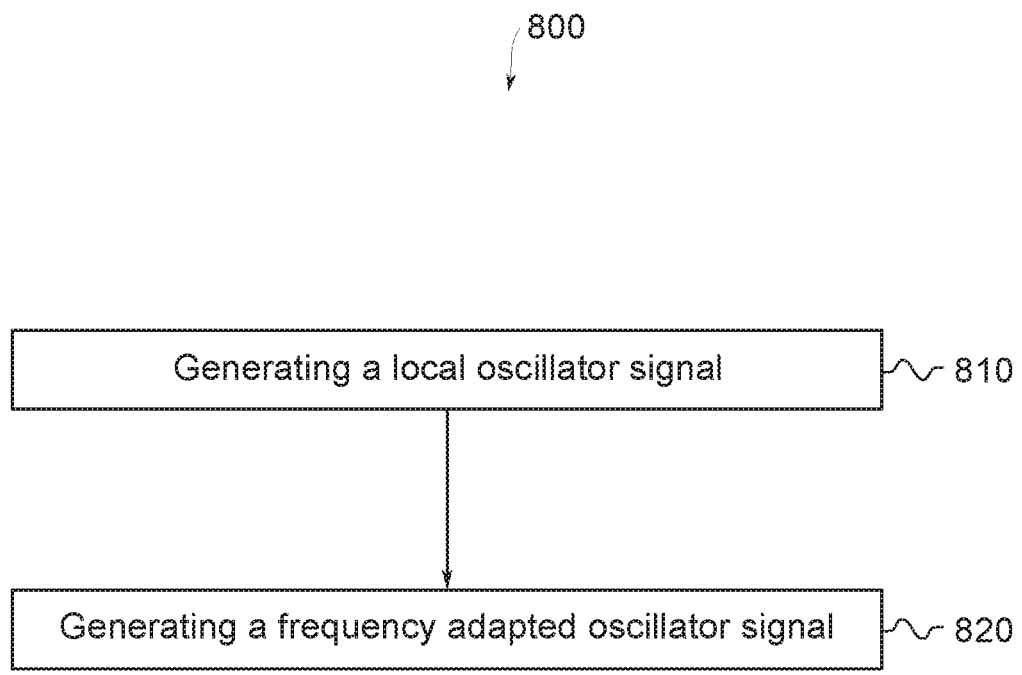
FIG. 8 shows a flowchart of a method for generating an oscillator signal.

FIG. 8 shows a flow chart of a method for generating an oscillator signal according to an example. The method 800 comprises generating 810 a local oscillator signal with a frequency of more than 700 MHz based on a mechanical resonator and generating 820 a frequency adapted signal based on the local oscillator signal.

Optionally, the method 800 further comprises generating the frequency converted signal based on the frequency adapted signal and a baseband transmit signal or a radio frequency receive signal.

Further optionally, the method 800 comprises providing a second frequency adapted signal based on the local oscillator signal and generating a second frequency converted signal based on the second frequency adapted signal and a baseband transmit signal or a radio frequency receive signal.

The method 800 may comprise one or more additional optional acts corresponding to one or more aspects described in connection with the proposed concept or one or more examples described above or below.

Figure 9:
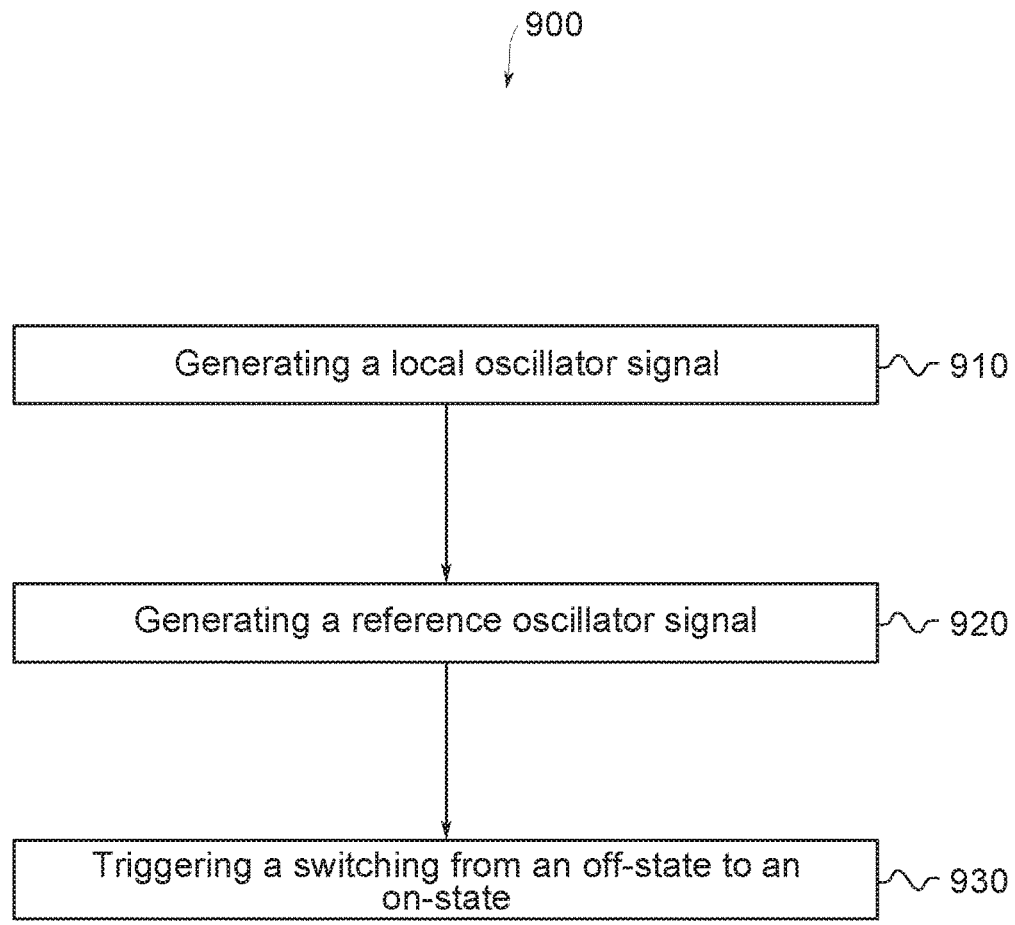
FIG. 9 shows a block diagram of another method for generating an oscillator signal.

FIG. 9 shows a flow chart of a method for generating an oscillator signal according to an example. The method 900 comprises generating 910 a local oscillator signal with a frequency of more than 700 MHz by a phase-locked-loop-less oscillator and generating 920 a reference oscillator signal with a frequency below 100 MHz. Further, the method 900 comprises triggering 930 a switching from an off-state to an on-state of the phase-locked-loop-less oscillator based on the reference oscillator signal.

Optionally the method 900 further comprises generating a frequency adapted signal based on the local oscillator signal and generating a frequency converted signal based on the frequency adapted signal and a baseband transmit signal or a radio frequency receive signal.

The method 900 may comprise one or more additional optional acts corresponding to one or more aspects described in connection with the proposed concept or one or more examples described above or below.

Figure 10:
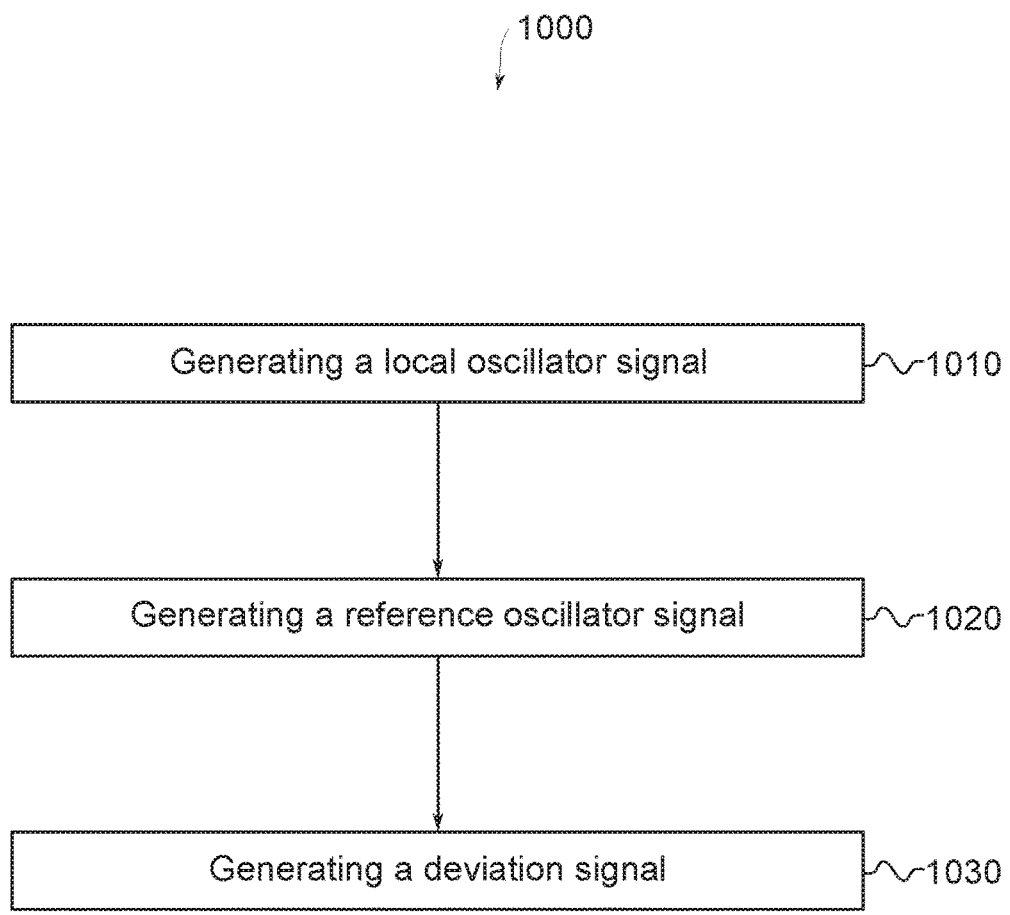
FIG. 10 shows a flowchart of another method for generating an oscillator signal.

FIG. 10 shows a flow chart of a method for generating an oscillator signal according to an example. The method 1000 comprises generating 1010 a local oscillator signal with a frequency of more than 700 MHz and generating 1020 a reference oscillator signal with a frequency below 100 MHz. Further, the method 1000 comprises generating 1030 a deviation signal based on the local oscillator signal and the reference oscillator signal, wherein the deviation signal comprises information indicating a deviation of the local oscillator signal or the reference oscillator signal from a desired behavior.

Optionally, the deviation signal comprises information indicating a temperature drift or an aging drift of the local oscillator signal or the reference oscillator signal.

The method 1000 may comprise one or more additional optional acts corresponding to one or more aspects described in connection with the proposed concept or one or more examples described above or below.

In the following examples pertain to further examples. Example 1 is an apparatus for generating an oscillator signal comprising a mechanical resonator based oscillator module configured to generate a local oscillator signal with a frequency of more than 700 MHz and a digital-to-time converter module configured to generate a frequency adapted signal based on the local oscillator signal.

In example 2, the subject matter of example 1 can optionally include the mechanical resonator based oscillator module being configured to generate the local oscillator signal based on a mechanical resonator element having a resonance frequency of more than 700 MHz.

In example 3, the subject matter of example 1 or 2 can optionally include the mechanical resonator based oscillator module being one of the group comprising a bulk acoustic wave based oscillator, a surface acoustic wave based oscillator, a piezoelectric effect based oscillator and a micro-electro-mechanical-system-based oscillator.

In example 4, the subject matter of any one of examples 1-3 can optionally include the mechanical resonator based oscillator module, the digital-to-time converter module and a signal path of the local oscillator signal between the mechanical resonator based oscillator module and the digital-to-time converter module being phase-locked-loop-less.

In example 5, the subject matter of any one of examples 1-4 can optionally include the mechanical resonator based oscillator module, the digital-to-time converter module and a signal path of the local oscillator signal between the mechanical resonator based oscillator module and the digital-to-time converter module being coil-less.

In example 6, the subject matter of one of the previous examples can optionally include an inductance between a local oscillator signal input terminal of the digital-to-time converter module and a reference potential terminal being lower 1 nH.

In example 7, the subject matter of one of the previous examples can optionally include the mechanical resonator based oscillator module being configured to generate the local oscillator signal with a frequency of more than 5 GHz.

In example 8, the subject matter of one of the previous examples can optionally include a frequency conversion module configured to generate a frequency converted signal based on the frequency adapted signal and a baseband transmit signal or a radio frequency receive signal.

In example 9, the subject matter of example 8 can optionally include the digital-to-time converter module being configured to generate the frequency adapted signal based on the local oscillator signal and a phase component of a baseband transmit signal, wherein the frequency conversion module is configured to generate a radio frequency transmit signal based on the frequency adapted signal and an amplitude component of the baseband transmit signal.

In example 10, the subject matter of any one of examples 8-9 can optionally include a second digital-to-time converter module configured to provide a second frequency adapted signal based on the local oscillator signal and a second frequency conversion module configured to generate a second frequency converted signal based on the second frequency adapted signal and a baseband transmit signal or a radio frequency receive signal.

In example 11, the subject matter example 10 can optionally include the second frequency conversion module being configured to generate a base band receive signal based on the second frequency adapted signal and a radio frequency receive signal.

In example 12, the subject matter of one of the previous examples can optionally include a low frequency oscillator module configured to generate a reference oscillator signal with a frequency below 100 MHz and a standby control module configured to trigger a switching from an off-state to an on-state of the mechanical resonator based oscillator module based on the reference oscillator signal.

In example 13, the subject matter of example 12 can optionally include the standby control module being configured to trigger a switching from an on-state to an off-state of the low frequency oscillator module, if the mechanical resonator based oscillator module is in an on-state.

In example 14, the subject matter of example 12 or 13 can optionally include a deviation determining module configured to generate a deviation signal based on the local oscillator signal and the reference oscillator signal, wherein the deviation signal comprises information indicating a deviation of the local oscillator signal or the reference oscillator signal from a desired behavior.

In example 15, the subject matter of any one of examples 12-14 can optionally include the digital-to-time converter module being configured to provide the frequency adapted signal based on the local oscillator signal and the deviation signal.

In example 16, the subject matter of any one of examples 12-15 can optionally include the low frequency oscillator module being a crystal oscillator.

In example 17, the subject matter of any one of examples 8-16 can optionally include the mechanical resonator based oscillator module, the digital-to-time converter module and the frequency conversion module being formed on the same semiconductor die.

In example 18, the subject matter of one of the previous examples can optionally include the digital-to-time converter module being configured to delay the local oscillator signal by a variable temporal delay to generate a frequency adapted signal comprising a frequency different from a frequency of the local oscillator signal.

Example 19 is an apparatus for generating an oscillator signal comprising a phase-locked-loop-less oscillator module configured to generate a local oscillator signal with a frequency of more than 700 MHz, a low frequency oscillator module configured to generate a reference oscillator signal with a frequency below 100 MHz and a standby control module configured to trigger a switching from an off-state to an on-state of the phase-locked-loop-less oscillator module based on the reference oscillator signal.

In example 20, the subject matter of example 19 can optionally include a digital-to-time converter module configured to provide a frequency adapted signal based on the local oscillator signal.

In example 21, the subject matter of any one of examples 19-20 can optionally include a frequency conversion module configured to generate the frequency converted signal based on the frequency adapted signal and a baseband transmit signal or a radio frequency receive signal.

Example 22 is an apparatus for generating an oscillator signal comprising a high frequency oscillator module configured to generate a local oscillator signal with a frequency of more than 700 MHz, a low frequency oscillator module configured to generate a reference oscillator signal with a frequency below 100 MHz and a deviation determining module configured to generate a deviation signal based on the local oscillator signal and the reference oscillator signal, wherein the deviation signal comprises information indicating a deviation of the local oscillator signal or the reference oscillator signal from a desired behavior.

In example 23, the subject matter of example 22 can optionally include the high frequency oscillator module being a mechanical resonator based oscillator module.

In example 24, the subject matter of example 22 or 23 can optionally include the deviation determining module being configured to generate the deviation signal based on a comparison of the local oscillator signal and the reference oscillator signal.

In example 25, the subject matter of any one of examples 22-24 can optionally include the deviation signal comprising information indicating a temperature drift or an aging drift of the local oscillator signal or the reference oscillator signal.

Example 26 is an apparatus for generating an oscillator signal comprising means for generating a local oscillator signal configured to generate a local oscillator signal with a frequency of more than 700 MHz based on a mechanical resonator and means for generating a frequency adapted signal configured to generate a frequency adapted signal based on the local oscillator signal.

In example 27, the subject matter of example 26 can optionally include means for generating a frequency converted signal configured to generate the frequency converted signal based on the frequency adapted signal and a baseband transmit signal or a radio frequency receive signal.

In example 28, the subject matter of example 26 or 27 can optionally include the means for generating a local oscillator signal being configured to generate the local oscillator signal based on a mechanical resonator element having a resonance frequency of more than 700 MHz.

Example 29 is an apparatus for generating an oscillator signal comprising means for generating a local oscillator signal configured to generate a local oscillator signal with a frequency of more than 700 MHz based on a mechanical resonator, means for generating a reference oscillator signal configured to generate a reference oscillator signal with a frequency below 100 MHz and means for triggering switching configured to trigger a switching from an off-state to an on-state of the means for generating a local oscillator signal on the reference oscillator signal.

In example 30, the subject matter of example 29 can optionally include means for generating a frequency converted signal configured to provide a frequency adapted signal based on the local oscillator signal.

In example 31, the subject matter of example 30 can optionally include means for generating a frequency converted signal configured to generate a frequency converted signal based on the frequency adapted signal and a baseband transmit signal or a radio frequency receive signal.

Example 32 is an apparatus for generating an oscillator signal comprising means for generating a local oscillator signal configured to generate a local oscillator signal with a frequency of more than 700 MHz, means for generating a reference oscillator signal configured to generate a reference oscillator signal with a frequency below 100 MHz and means for generating a deviation signal configured to generate a deviation signal based on the local oscillator signal and the reference oscillator signal, wherein the deviation signal comprises information indicating a deviation of the local oscillator signal or the reference oscillator signal from a desired behavior.

In example 33, the subject matter of example 32 can optionally include the deviation signal comprising information indicating a temperature drift or an aging drift of the local oscillator signal or the reference oscillator signal.

Example 34 is a transmitter, a receiver or a transceiver comprising an apparatus according to one of the previous examples.

Example 35 is a mobile device comprising a transmitter, a receiver or a transceiver according to example 34.

Example 36 is a cell phone comprising a transmitter, a receiver or a transceiver according to example 34.

Example 37 is a method for generating an oscillator signal comprising generating a local oscillator signal with a frequency of more than 700 MHz based on a mechanical resonator and generating a frequency adapted signal based on the local oscillator signal.

In example 38, the subject matter of example 37 can optionally include generating the frequency converted signal based on the frequency adapted signal and a baseband transmit signal or a radio frequency receive signal.

In example 39, the subject matter of example 38 can optionally include providing a second frequency adapted signal based on the local oscillator signal and generating a second frequency converted signal based on the second frequency adapted signal and a baseband transmit signal or a radio frequency receive signal.

Example 40 is a method for generating an oscillator signal comprising generating a local oscillator signal with a frequency of more than 700 MHz by a phase-locked-loop-less oscillator, generating a reference oscillator signal with a frequency below 100 MHz and triggering a switching from an off-state to an on-state of the phase-locked-loop-less oscillator based on the reference oscillator signal.

In example 41, the subject matter of example 40 can optionally include generating a frequency adapted signal based on the local oscillator signal and generating a frequency converted signal based on the frequency adapted signal and a baseband transmit signal or a radio frequency receive signal.

Example 42 is a method for generating an oscillator signal comprising generating a local oscillator signal with a frequency of more than 700 MHz, generating a reference oscillator signal with a frequency below 100 MHz and generating a deviation signal based on the local oscillator signal and the reference oscillator signal, wherein the deviation signal comprises information indicating a deviation of the local oscillator signal or the reference oscillator signal from a desired behavior.

In example 43, the subject matter of example 42 can optionally include the deviation signal comprising information indicating a temperature drift or an aging drift of the local oscillator signal or the reference oscillator signal.

Example 44 is a machine readable storage medium including program code, when executed, to cause a machine to perform the method of one of the examples 37 to 43.

Example 45 is a machine readable storage including machine readable instructions, when executed, to implement a method or realize an apparatus as implemented by any one of examples 1-43.

Example 46 is a computer program having a program code for performing the method of one of the examples 37 to 43, when the computer program is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. An apparatus for generating an oscillator signal comprising:
   a mechanical resonator based oscillator circuit configured to generate a local oscillator signal with a frequency of more than 700 MHz;
   a digital-to-time converter circuit configured to generate a frequency adapted signal based on the local oscillator signal;
   a mixing circuit configured to generate a frequency converted signal based on the frequency adapted signal and a radio frequency receive signal or a signal associated therewith;
   a low frequency oscillator circuit configured to generate a reference oscillator signal with a frequency below 100 MHz; and
   a standby control circuit configured to trigger a switching from an off-state to an on-state of the mechanical resonator based oscillator circuit based on the reference oscillator signal,
   wherein the frequency converted signal comprises a baseband receive signal, and
   wherein the standby control circuit is configured to trigger a switching from an on-state to an off-state of the low frequency oscillator circuit, if the mechanical resonator based oscillator circuit is in an on-state.

2. The apparatus according to claim 1, wherein the mechanical resonator based oscillator circuit is configured to generate the local oscillator signal based on a mechanical resonator element having a resonance frequency of more than 700 MHz.

3. The apparatus according to claim 1, wherein the mechanical resonator based oscillator circuit is one of the group comprising a bulk acoustic wave based oscillator, a surface acoustic wave based oscillator, a piezoelectric effect based oscillator and a micro-electro-mechanical-system-based oscillator.

4. The apparatus according to claim 1, wherein the mechanical resonator based oscillator circuit, the digital-to-time converter circuit and a signal path of the local oscillator signal between the mechanical resonator based oscillator circuit and the digital-to-time converter circuit are phase-locked-loop-less.

5. The apparatus according to claim 1, wherein the mechanical resonator based oscillator circuit, the digital-to-time converter circuit and a signal path of the local oscillator signal between the mechanical resonator based oscillator circuit and the digital-to-time converter circuit are coil-less.

6. The apparatus according to claim 1, wherein an inductance between a local oscillator signal input terminal of the digital-to-time converter circuit and a reference potential terminal is lower than 1 nH.

7. The apparatus according to claim 1, wherein the mechanical resonator based oscillator circuit is configured to generate the local oscillator signal with a frequency of more than 3 GHz.

8. The apparatus according to claim 1, further comprising:
   a second digital-to-time converter circuit configured to provide a second frequency adapted signal based on the local oscillator signal; and
   a second mixing circuit configured to generate a second frequency converted signal based on the second frequency adapted signal and a baseband transmit signal or a radio frequency receive signal.

9. The apparatus according to claim 8, wherein the second mixing circuit is configured to generate a radio frequency transmit signal based on the second frequency adapted signal and a baseband transmit signal.

10. The apparatus according to claim 1, further comprising a deviation determining circuit configured to generate a deviation signal based on the local oscillator signal and the reference oscillator signal, wherein the deviation signal comprises information indicating a deviation of the local oscillator signal or the reference oscillator signal from a desired behavior.

11. The apparatus according to claim 1, wherein the mechanical resonator based oscillator circuit, the digital-to-time converter circuit and the mixing circuit are formed on the same semiconductor die.

12. The apparatus according to claim 1, wherein the mechanical resonator based oscillator circuit is not on the same semiconductor die as at least one of the digital-to-time converter circuit and the mixing circuit.

13. An apparatus for generating an oscillator signal, comprising:
   one or more processors configured to:
      receive a local oscillator signal with a frequency of more than 700 MHz generated by a mechanical resonator; and
      generate a frequency adapted signal based on the local oscillator signal, wherein the one or more processors is further configured to:
      receive a reference oscillator signal with a frequency below 100 MHz from a low frequency oscillator circuit; and
      trigger a switching from an off-state to an on-state of the mechanical resonator based on the reference oscillator signal,
   wherein the one or more processors are configured to trigger a switching from an on-state to an off-state of the low frequency oscillator circuit, if the mechanical resonator is in an on-state.

14. The apparatus according to claim 13, wherein the mechanical resonator and the one or more processors are formed on the same semiconductor die.

15. The apparatus according to claim 13, wherein the one or more processors are configured to delay the local oscillator signal by a variable temporal delay to generate a frequency adapted signal comprising a frequency different from a frequency of the local oscillator signal.

16. The apparatus according to claim 13, wherein the mechanical resonator is one of the group comprising a bulk acoustic wave based oscillator, a surface acoustic wave based oscillator, a piezoelectric effect based oscillator and a micro-electro-mechanical-system-based oscillator.

17. An apparatus for generating an oscillator signal comprising:
   a mechanical resonator based oscillator circuit configured to generate a local oscillator signal with a frequency of more than 700 MHz;
   a digital-to-time converter circuit configured to generate a frequency adapted signal based on the local oscillator signal and a phase component of a baseband transmit signal; and
   a mixing circuit configured to generate a frequency converted signal based on the frequency adapted signal and the baseband transmit signal,
   wherein the frequency converted signal comprises a radio frequency transmit signal.

* * * * *